(12) United States Patent
Tien et al.

(10) Patent No.: US 9,740,055 B2
(45) Date of Patent: Aug. 22, 2017

(54) PIXEL STRUCTURE, PIXEL ARRAY, AND DISPLAY PANEL

(71) Applicant: Au Optronics Corporation, Hsinchu (TW)

(72) Inventors: Kun-Cheng Tien, New Taipei (TW); Shin-Mei Gong, Taoyuan County (TW); Chih-Chang Shih, Hsinchu County (TW); Chien-Huang Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 123 days.

(21) Appl. No.: 14/509,066

(22) Filed: Oct. 8, 2014

(65) Prior Publication Data

US 2015/0332648 A1 Nov. 19, 2015

(30) Foreign Application Priority Data

May 13, 2014 (TW) .............................. 103116875 A

(51) Int. Cl.
*G02F 1/1343* (2006.01)
*G09G 3/36* (2006.01)
(Continued)

(52) U.S. Cl.
CPC ...... *G02F 1/1343* (2013.01); *G02F 1/136213* (2013.01); *G09G 3/2003* (2013.01);
(Continued)

(58) Field of Classification Search
CPC ...... G09G 3/3638; G09G 3/2003; G09G 5/04; G09G 3/00; G09G 2300/0413; G09G 2300/0439; G09G 2300/0443; G09G 2300/0447; G09G 2300/0452; G09G 2300/0456; G09G 2300/046; G09G 2300/0465; G09G 2300/0469; G09G 2300/0473; G09G 2300/0478; G09G 2300/0482; G09G 2310/027;
(Continued)

(56) References Cited

U.S. PATENT DOCUMENTS

| | | | |
|---|---|---|---|
| 6,503,772 B1 * | 1/2003 | Ohtsu | .................. G02F 1/1362 257/E21.414 |
| 6,680,771 B2 | 1/2004 | Yu et al. | |

(Continued)

FOREIGN PATENT DOCUMENTS

| | | |
|---|---|---|
| CN | 101546543 | 9/2009 |
| CN | 102566180 | 7/2012 |

(Continued)

*Primary Examiner* — Grant Sitta
(74) *Attorney, Agent, or Firm* — Jianq Chyun IP Office

(57) ABSTRACT

A pixel structure is provided. The pixel structure includes an active device, a first pixel electrode, a second pixel electrode, and a conductive line. The first pixel electrode is electrically connected to the active device. The second pixel electrode and the first pixel electrode are electrically insulated. The conductive line is located below the first pixel electrode and the second pixel electrode. The active device is electrically connected to the first pixel electrode through the conductive line. The conductive line is coupled to the second pixel electrode to form a coupling capacitance.

10 Claims, 10 Drawing Sheets

(51) Int. Cl.
G09G 3/20 (2006.01)
G09G 5/04 (2006.01)
H01L 27/12 (2006.01)
G02F 1/1362 (2006.01)

(52) U.S. Cl.
CPC ............. G09G 3/3648 (2013.01); G09G 5/04 (2013.01); H01L 27/12 (2013.01); *G02F 2001/134345* (2013.01); *G02F 2001/134354* (2013.01); *G09G 2300/0452* (2013.01); *G09G 2320/0242* (2013.01)

(58) Field of Classification Search
CPC ... G09G 2310/0272; G09G 2310/0275; G09G 2310/0278; G09G 2310/0297; G09G 3/20; G09G 3/2007; G09G 3/2011; G09G 3/2014; G09G 3/2018; G09G 3/2022; G09G 3/2025; G09G 3/2029
USPC .......................................... 345/204, 87, 690
See application file for complete search history.

(56) References Cited

U.S. PATENT DOCUMENTS

| 7,589,813 | B2 | 9/2009 | Chen et al. | |
|---|---|---|---|---|
| 7,924,354 | B2 | 4/2011 | Lu et al. | |
| 8,334,882 | B2 | 12/2012 | Yoshida | |
| 2002/0109813 | A1* | 8/2002 | Yu | G02F 1/133707 349/141 |
| 2004/0174375 | A1* | 9/2004 | Credelle | G09G 3/3607 345/589 |
| 2005/0030439 | A1* | 2/2005 | Lyu | G02F 1/134336 349/38 |
| 2005/0036091 | A1* | 2/2005 | Song | G02F 1/133707 349/129 |
| 2005/0122441 | A1* | 6/2005 | Shimoshikiryoh | G02F 1/13624 349/38 |
| 2006/0023137 | A1* | 2/2006 | Kamada | G02F 1/136213 349/44 |
| 2006/0028589 | A1* | 2/2006 | Um | G02F 1/134336 349/33 |
| 2006/0268186 | A1* | 11/2006 | Kamada | G02F 1/136213 349/38 |
| 2007/0018927 | A1* | 1/2007 | Kim | G02F 1/13624 345/92 |
| 2007/0211007 | A1* | 9/2007 | Su | G09G 3/2074 345/92 |
| 2008/0180455 | A1* | 7/2008 | Ogino | G09G 3/2003 345/589 |
| 2009/0002618 | A1* | 1/2009 | Lee | G02F 1/133707 349/129 |
| 2009/0040243 | A1* | 2/2009 | Hisada | G09G 3/3614 345/690 |
| 2009/0262147 | A1* | 10/2009 | Yoshida | G09G 3/3648 345/690 |
| 2011/0267327 | A1* | 11/2011 | Hwang | G09G 3/3208 345/211 |
| 2012/0105785 | A1* | 5/2012 | Kim | G09G 3/3648 349/139 |
| 2013/0300778 | A1* | 11/2013 | Hsieh | G09G 3/003 345/690 |
| 2014/0247418 | A1* | 9/2014 | Chen | G02F 1/133707 349/144 |

FOREIGN PATENT DOCUMENTS

| CN | 103578444 | 2/2014 |
|---|---|---|
| JP | H07325322 | 12/1995 |
| JP | H09269509 | 10/1997 |
| JP | 2008309884 | 12/2008 |
| TW | 513604 | 12/2002 |
| TW | 201003626 | 1/2010 |
| TW | 201245828 | 11/2012 |

* cited by examiner

PIXEL STRUCTURE, PIXEL ARRAY, AND DISPLAY PANEL

CROSS-REFERENCE TO RELATED APPLICATION

This application claims the priority benefit of Taiwan application serial no. 103116875, filed on May 13, 2014. The entirety of the above-mentioned patent application is hereby incorporated by reference herein and made a part of this specification.

BACKGROUND OF THE INVENTION

Field of the Invention

The invention relates to a pixel structure, a pixel array and a display panel. More particularly, the invention relates to a pixel structure, a pixel array and a display panel that reduce a color shift phenomenon.

Description of Related Art

Owing to their superior characteristics such as high space utilization efficiency, low power consumption, no radiation and low electromagnetic interference, etc., liquid crystal display panels have become the mainstream in the market. As the sizes of liquid crystal displays become larger, in order to overcome viewing angle problems in large-sized displays, wide viewing angle techniques for liquid crystal display panels have also been developed. These techniques include: multi-domain vertical alignment (MVA), multi-domain horizontal alignment (MHA), twisted nematic plus wide viewing film and in-plane switching (IPS), etc.

Although the liquid crystal display panels that employs the above-mentioned techniques are able to achieve the purpose of a wide viewing angle, a color shift phenomenon thereof is still a problem difficult to handle. For example, when these techniques are employed, the following situations are still met: compared to a front-view image, a side-view image goes bluish at a low gray level, goes reddish or greenish at a mid gray level, and goes greenish or yellowish at a high gray level. Namely, a problem of color shift in a side view occurs, and this causes the side-view image of the display panel to look unnatural. Therefore, there is an urgent demand for a liquid crystal display panel that mitigates both a problem of whitishness in the side view and a problem of yellowishness or greenishness in the side view when pixels are at a high gray level.

SUMMARY OF THE INVENTION

The invention provides a pixel structure that mitigates a problem of yellowishness or greenishness in a side view when pixels are at a high gray level. The invention also provides a pixel array constituted by the above-mentioned pixel structure.

The invention further provides a display panel, wherein when the pixels are at a high gray level, the problem of yellowishness or greenishness in a side-view image is mitigated.

The invention proposes a pixel structure including an active device, a first pixel electrode, a second pixel electrode and a conductive line. The first pixel electrode is electrically connected to the active device. The second pixel electrode is electrically insulated from the first pixel electrode. The conductive line is located below the first pixel electrode and the second pixel electrode, wherein the active device is electrically connected to the first pixel electrode through the conductive line, and the conductive line is coupled to the second pixel electrode to form a coupling capacitance.

The invention proposes a pixel structure including an active device, a main pixel electrode and at least one sub-pixel electrode. The main pixel electrode is electrically connected to the active device, wherein the main pixel electrode includes a plurality of first branch patterns, wherein a slit width between adjacent first branch patterns is ST1. The at least one sub-pixel electrode is electrically connected to the active device, wherein the at least one sub-pixel electrode includes a plurality of second branch patterns, wherein a slit width between adjacent second branch patterns is ST2, wherein ST1<ST2.

The invention proposes a pixel structure including a plurality of first pixel structures and a plurality of second pixel structures. Each first pixel structure includes a first active device and a first pixel electrode. The first pixel electrode is electrically connected to the first active device. Each second pixel structure includes a second active device, a second pixel electrode, a third pixel electrode and a conductive line. The second pixel electrode is electrically connected to the second active device. The third pixel electrode is electrically insulated from the second pixel electrode. The conductive line is located below the second pixel electrode and the third pixel electrode, wherein the second active device is electrically connected to the second pixel electrode through the conductive line, and the conductive line is coupled to the third pixel electrode to form a coupling capacitance.

The invention further proposes a display panel including a first substrate, a second substrate, a color filter layer and a display medium. The first substrate includes the above-mentioned pixel array disposed thereon. The second substrate is located opposite to the first substrate. The color filter layer is located on the first substrate or the second substrate. The display medium is located between the first substrate and the second substrate.

Based on the above, in the pixel structure of the invention, the pixel electrode is divided into two electrodes, and these two pixel electrodes are electrically insulated from each other. The active device is electrically connected to one of the pixel electrodes, and the conductive line is coupled to another pixel electrode to form a coupling capacitance. In this way, the two pixel electrodes in the same pixel structure have different voltages during a driving process, such that the color shift in the side view of the display panel is reduced.

To make the above features and advantages of the invention more comprehensible, embodiments accompanied with drawings are described in detail as follows.

DETAILED DESCRIPTION OF DISCLOSED EMBODIMENTS

Figure 1:
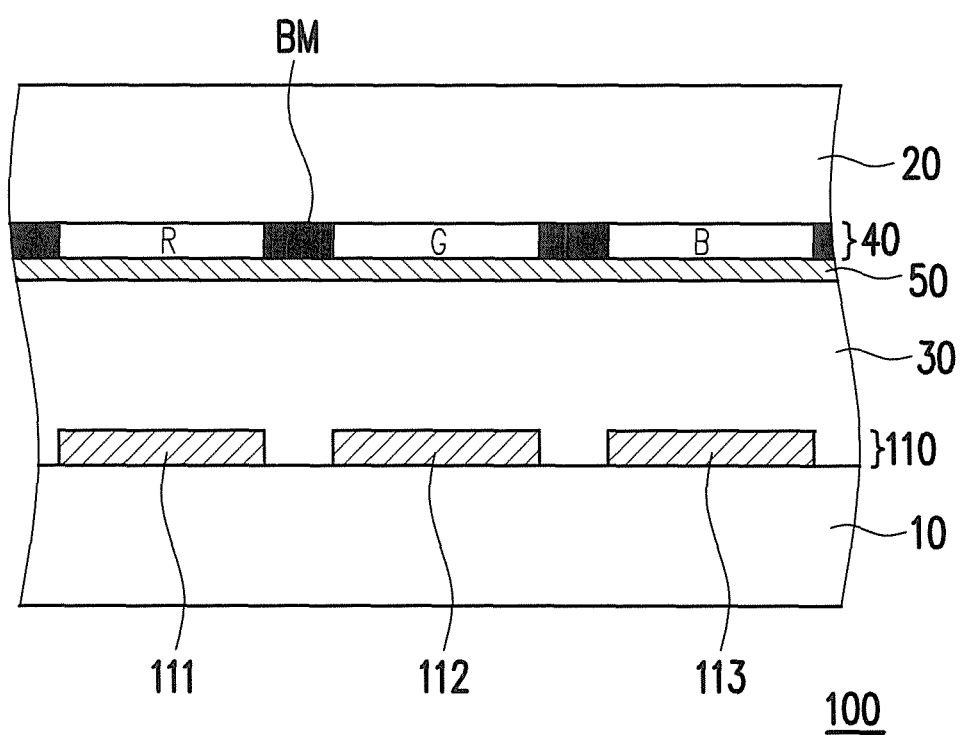
FIG. 1 is a cross-sectional view of a display panel according to an embodiment of the invention.

FIG. 1 is a cross-sectional view of a display panel according to an embodiment of the invention. Referring to FIG. 1, a display panel 100 includes a first substrate 10, a second substrate 20, a display medium 30 and a color filter layer 40. The display panel 100 is, e.g., a liquid crystal display panel or a display panel of other types.

A material of the first substrate 10 includes glass, quartz, organic polymers, or opaque/reflective materials (e.g. metals), etc. The first substrate 10 includes a pixel array 110 disposed thereon. The pixel array 110 includes a plurality of pixel structures 111, 112 and 113.

The second substrate 20 is located opposite to the first substrate 10. A material of the second substrate 20 includes glass, quartz or organic polymers, etc. The display medium 30 is located between the first substrate 10 and the second substrate 20. If the display panel 100 is a liquid crystal display panel, the display medium 30 is, e.g., liquid crystal molecules.

The color filter layer 40 is located on the second substrate 20. However, the invention is not limited thereto. In other embodiments, the color filter layer 40 may be located on the first substrate 10. As shown in FIG. 1, the color filter layer 40 includes a plurality of red filter patterns R, a plurality of blue filter patterns B, and a plurality of green filter patterns G. In the present embodiment, the red filter patterns R and the green filter patterns G are disposed corresponding to the pixel structures 111 and 112 of the pixel array 110 on the first substrate 10. Moreover, the blue filter patterns B are disposed corresponding to the pixel structure 113 of the pixel array 110 on the first substrate 10. However, the invention is not limited thereto. In addition, the second substrate 20 further includes a black matrix BM disposed thereon. The black matrix BM has a plurality of openings. The red filter patterns R, the blue filter patterns B and the green filter patterns G are respectively disposed in these openings.

In the present embodiment, the display panel 100 further includes an electrode layer 50. The electrode layer 50 is a transparent conductive layer, and a material thereof includes metal oxides such as indium tin oxide or indium zinc oxide, etc. The electrode layer 50 is disposed between the color filter layer 40 and the display medium 30, and the electrode layer 50 completely covers the color filter layer 40. However, the invention is not limited thereto. The electrode layer 50 generates an electric field between itself and the pixel array 110 to control or drive the display medium 30.

Figure 2:
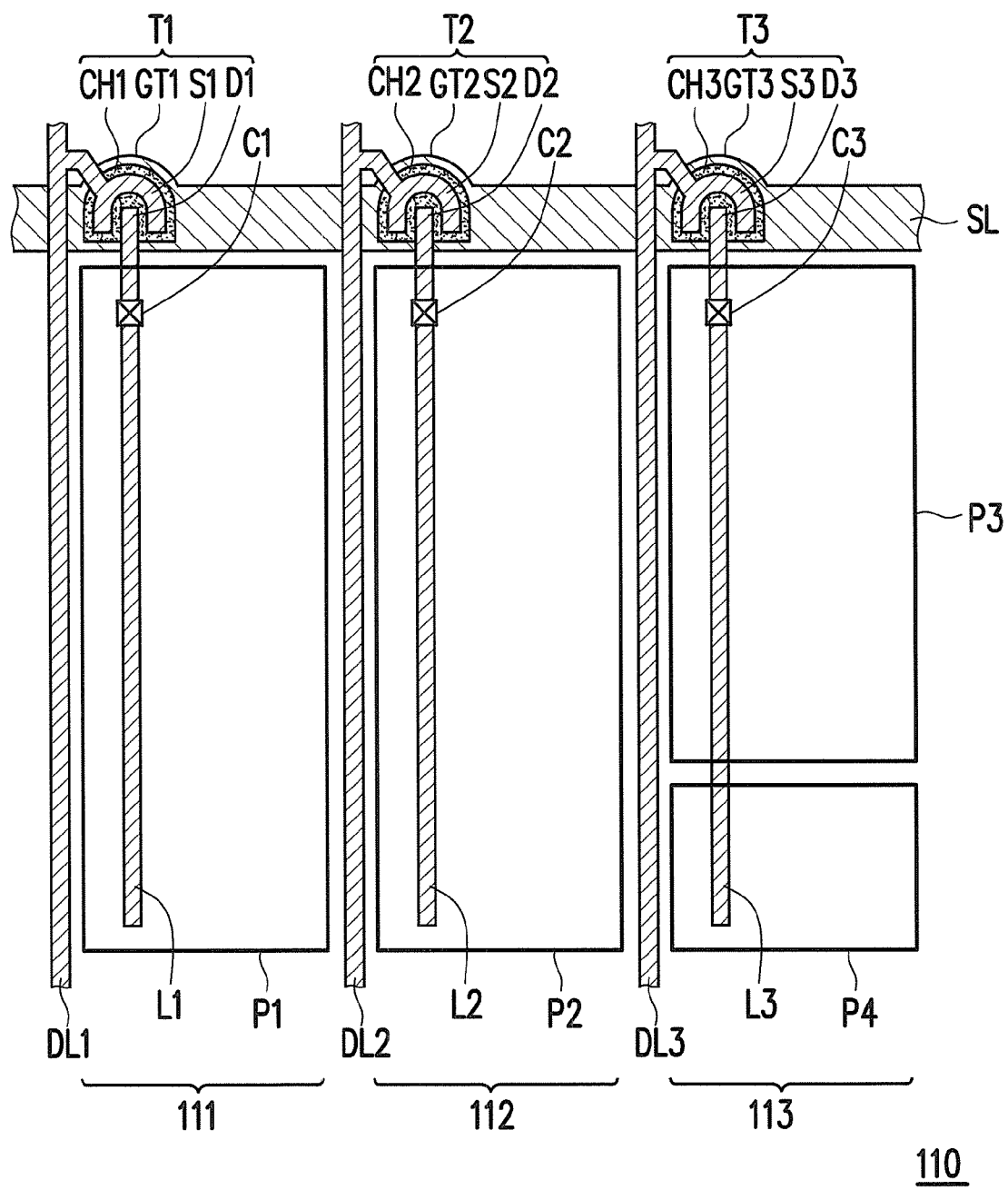
FIG. 2 is a schematic top view of a pixel array of the display panel in FIG. 1 according to an embodiment of the invention.

FIG. 2 is a schematic top view of a pixel array of the display panel in FIG. 1. The pixel array 110 in FIG. 2 includes a plurality of pixel structures 111, 112 and 113. For clarity, FIG. 2 only illustrates one pixel structure 111, one pixel structure 112 and one pixel structure 113. However, it should be apparent to persons of ordinary skill in the art that the pixel array 110 may include even more pixel structures. In the present embodiment, in view of transmittance and brightness of the display panel, the pixel structures 111, 112 and 113 respectively correspond to a red sub-pixel region, a green sub-pixel region and a blue sub-pixel region. However, the invention is not limited thereto.

The pixel structure 111 includes a scan line SL, a data line DL1, an active device T1 and a pixel electrode P1.

An extension direction of the scan line SL is different from an extension direction of the data line DL1. It is preferred that the extension direction of the scan line SL is perpendicular to the extension direction of the data line DL1. In addition, the scan line SL and the data line DL1 are located in different layers, and sandwich an insulating layer (not illustrated) therebetween. The scan line SL and the data line DL1 are mainly configured to transmit a driving signal for driving the pixel structure 111. In view of conductivity, the scan line SL and the data line DL1 are generally made of metal materials. However, the invention is not limited thereto. According to other embodiments, the scan line SL and the data line DL1 may also be made of other conductive materials, such as alloys, metal oxides, metal nitrides, metal oxynitrides or stacked layers of metal materials and other conductive materials.

The active device T1 is correspondingly electrically connected to the scan line SL and the data line DL1. Here, the active device T1 is, e.g., a thin film transistor (TFT), and includes a gate GT1, a channel layer CH1, a drain D1 and a source S1. The gate GT1 is electrically connected to the scan line SL. The source S1 is electrically connected to the data line DL1. In other words, when a control signal is input to the scan line SL, there is an electric connection between the scan line SL and the gate GT1. When a control signal is input to the data line DL1, there is an electric connection between the data line DL1 and the source S1. The channel layer CH1 is located above the gate GT1 and below the source S1 and the drain D1. The present embodiment provides an example where the active device T1 is a bottom-gate thin film transistor. However, the invention is not limited thereto. In other embodiments, the active device T1 may be a top-gate thin film transistor.

As shown in FIG. 2, the pixel electrode P1 is correspondingly electrically connected to the active device T1. In detail, the drain D1 and a conductive line L1 are connected to each other. In the present embodiment, the drain D1 and the conductive line L1 are located in the same layer. However, the invention is not limited thereto. The conductive line L1 is located below the pixel electrode P1. A contact C1 is disposed between the conductive line L1 and the pixel electrode P1. The active device T1 is electrically connected to the pixel electrode P1 through the contact C1. The pixel electrode P1 is, e.g., a transparent conductive layer, and includes metal oxides, such as indium tin oxide, indium zinc oxide, aluminum tin oxide, aluminum zinc oxide, indium germanium zinc oxide or other suitable oxides, or stacked layers of at least two of the above.

In the present embodiment, the pixel electrode P1 is an electrode having a block pattern. However, the invention is not limited thereto. In other embodiments, the pixel electrode P1 may be an electrode having other specific patterns, including a plurality of V-shaped branch portions or an electrode having a Union Jack-like pattern or other patterns (not illustrated). For example, in the case where the pixel electrode P1 is an electrode having a Union Jack-like pattern, four alignment domain regions are formed in the pixel structure 111, such that a plurality of liquid crystal molecules in the display medium 30 are tilted along four alignment directions (not illustrated).

Similarly, the pixel structure 112 includes the scan line SL, a data line DL2, an active device T2 and a pixel electrode P2.

An extension direction of the scan line SL is different from an extension direction of the data line DL2. It is preferred that the extension direction of the scan line SL is perpendicular to the extension direction of the data line DL2. In addition, the scan line SL and the data line DL2 are located in different layers, and sandwich an insulating layer (not illustrated) therebetween. The scan line SL and the data line DL2 are mainly configured to transmit a driving signal for driving the pixel structure 112. In view of conductivity, the scan line SL and the data line DL2 are generally made of metal materials. However, the invention is not limited thereto. According to other embodiments, the scan line SL and the data line DL2 may also be made of other conductive materials, such as alloys, metal oxides, metal nitrides, metal oxynitrides or stacked layers of metal materials and other conductive materials.

The active device T2 is correspondingly electrically connected to the scan line SL and the data line DL2. Here, the active device T2 is, e.g., a thin film transistor (TFT), and includes a gate GT2, a channel layer CH2, a drain D2 and a source S2. The gate GT2 is electrically connected to the scan line SL. The source S2 is electrically connected to the data line DL2. In other words, when a control signal is input to the scan line SL, there is an electric connection between the scan line SL and the gate GT2. When a control signal is input to the data line DL2, there is an electric connection between the data line DL2 and the source S2. The channel layer CH2 is located above the gate GT2 and below the source S2 and the drain D2. The present embodiment provides an example where the active device T2 is a bottom-gate thin film transistor. However, the invention is not limited thereto. In other embodiments, the active device T2 may be a top-gate thin film transistor.

As shown in FIG. 2, the pixel electrode P2 is correspondingly electrically connected to the active device T2. In detail, the drain D2 and a conductive line L2 are connected to each other. In the present embodiment, the drain D2 and the conductive line L2 are located in the same layer. However, the invention is not limited thereto. The conductive line L2 is located below the pixel electrode P2. A contact C2 is disposed between the conductive line L2 and the pixel electrode P2. The active device T2 is electrically connected to the pixel electrode P2 through the contact C2. The pixel electrode P2 is, e.g., a transparent conductive layer, and includes metal oxides, such as indium tin oxide, indium zinc oxide, aluminum tin oxide, aluminum zinc oxide, indium germanium zinc oxide or other suitable oxides, or stacked layers of at least two of the above.

In the present embodiment, the pixel electrode P2 is an electrode having a block pattern. However, the invention is not limited thereto. In other embodiments, the pixel electrode P2 may be an electrode having other specific patterns, including a plurality of V-shaped branch portions or an electrode having a Union Jack-like pattern or other patterns (not illustrated). For example, in the case where the pixel electrode P2 is an electrode having a Union Jack-like pattern, four alignment domain regions are formed in the pixel structure 112, such that a plurality of liquid crystal molecules in the display medium 30 are tilted along four alignment directions (not illustrated).

The pixel structure 113 includes the scan line SL, a data line DL3, an active device T3, and pixel electrodes P3 and P4. It is worth mentioning that the pixel electrodes P3 and P4 of the pixel structure 113 do not directly contact each other.

The extension direction of the scan line SL is different from an extension direction of the data line DL3. It is preferred that the extension direction of the scan line SL is perpendicular to the extension direction of the data line DL3. In addition, the scan line SL and the data line DL3 are located in different layers, and sandwich an insulating layer (not illustrated) therebetween. The scan line SL and the data line DL3 are mainly configured to transmit a driving signal for driving the pixel structure 113. In view of conductivity, the scan line SL and the data line DL3 are generally made of metal materials. However, the invention is not limited thereto. According to other embodiments, the scan line SL and the data line DL3 may also be made of other conductive materials, such as alloys, metal oxides, metal nitrides, metal oxynitrides or stacked layers of metal materials and other conductive materials.

The active device T3 is correspondingly electrically connected to the scan line SL and the data line DL3. Here, the active device T3 is, e.g., a thin film transistor (TFT), and includes a gate GT3, a channel layer CH3, a drain D3 and a source S3. The gate GT3 is electrically connected to the scan line SL. The source S3 is electrically connected to the data line DL3. In other words, when a control signal is input to the scan line SL, there is an electric connection between the scan line SL and the gate GT3. When a control signal is input to the data line DL3, there is an electric connection between the data line DL3 and the source S3. The channel layer CH3 is located above the gate GT3 and below the source S3 and the drain D3. The present embodiment provides an example where the active device T3 is a bottom-gate thin film transistor. However, the invention is not limited thereto. In other embodiments, the active device T3 may be a top-gate thin film transistor.

As shown in FIG. 2, the pixel electrode P3 is correspondingly electrically connected to the active device T3. In detail, the drain D3 and a conductive line L3 are connected to each other. In the present embodiment, the drain D3 and the conductive line L3 are located in the same layer. However, the invention is not limited thereto. The conductive line L3 is located below the pixel electrode P3. A contact C3 is disposed between the conductive line L3 and the pixel electrode P3. The active device T3 is electrically connected to the pixel electrode P3 through the contact C3. The pixel electrode P3 is, e.g., a transparent conductive layer, and includes metal oxides, such as indium tin oxide, indium zinc oxide, aluminum tin oxide, aluminum zinc oxide, indium germanium zinc oxide or other suitable oxides, or stacked layers of at least two of the above.

In the present embodiment, the pixel electrodes P3 and P4 are electrodes having a block pattern. However, the invention is not limited thereto. In other embodiments, the pixel electrodes P3 and P4 may be electrodes having other specific patterns, including a plurality of V-shaped branch portions or electrodes having a Union Jack-like pattern or other patterns (not illustrated). For example, in the case where the pixel electrodes P3 and P4 are electrodes having a Union Jack-like pattern, eight alignment domain regions are formed in the pixel structure 113, such that a plurality of liquid crystal molecules in the display medium 30 are tilted along eight alignment directions (not illustrated).

Particularly, the pixel electrode P3 is electrically connected to the active device T3, and the pixel electrode P4 is electrically insulated from the pixel electrode P3. In detail, the drain D3 of the active device T3 and the conductive line L3 are connected to each other. In the present embodiment, the drain D3 and the conductive line L3 are located in the same layer. However, the invention is not limited thereto. The conductive line L3 is located below the pixel electrodes P3 and P4, and the contact C3 is disposed between the conductive line L3 and the pixel electrode P3. The active device T3 is electrically connected to the pixel electrode P3 through the contact C3. In addition, the conductive line L3 is coupled to the pixel electrode P4 to form a coupling capacitance. The pixel electrodes P3 and P4 respectively have voltages $V_{P3}$ and $V_{P4}$.

It is worth mentioning that, in the present embodiment, by dividing a pixel electrode of the pixel structure 113 that corresponds to the blue sub-pixel region into the pixel electrode P3 having a larger area and the pixel electrode P4 having a smaller area, and through the above-mentioned coupled driving design, the blue sub-pixel region is provided with the two different pixel voltages $V_{P3}$ and $V_{P4}$, thereby producing different brightnesses. In this way, the color shift in a side view of pixels at a high gray level is reduced. In addition, the blue sub-pixel region itself is oversaturated. Even if the pixel electrode P4 having the lower voltage $V_{P4}$ is separately formed, the resulting reduction in brightness is little because the blue color contributes very little to the brightness. Therefore, the design of the pixel structure 113 has a minor impact on transmittance of the display panel 100. Based on calculation results, a ratio of an area of the pixel electrode P3 to an area of the pixel electrode P4 is preferably 4:1, and a voltage ratio $V_{P3}/V_{P4}$ of the pixel electrode P3 to the pixel electrode P4 is preferably 2.85:2.3.

Figure 3:
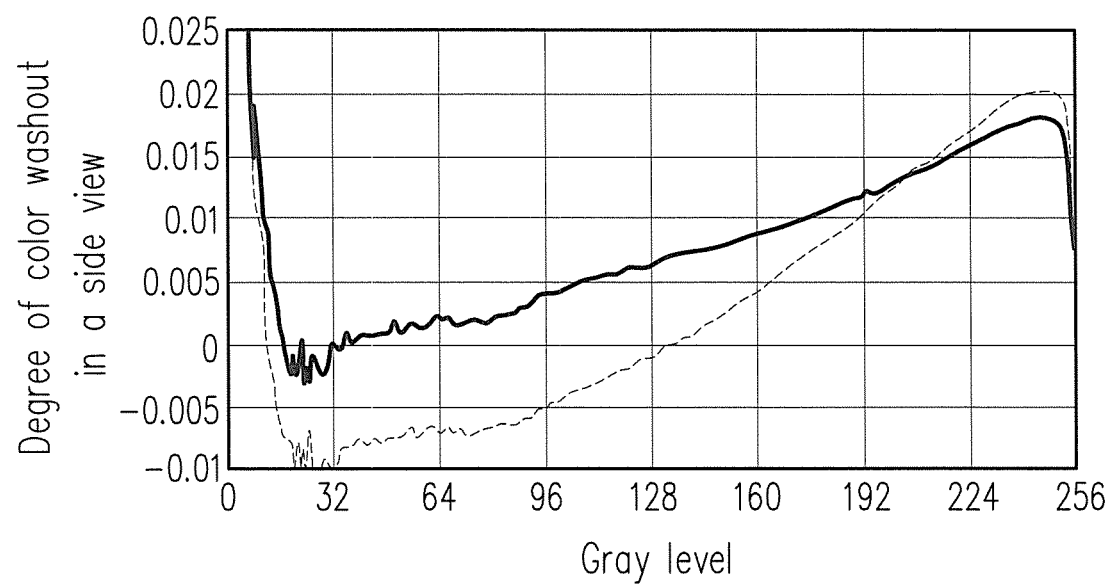
FIG. 3 illustrates a relationship between gray level and color shift in a side view in the display panel in FIG. 1.

FIG. 3 illustrates a relationship between gray level and color shift in a side view in the display panel in FIG. 1. Referring to FIG. 3, the horizontal axis indicates the gray level, and the vertical axis indicates degree of color shift in a side view. The solid line represents results of the display panel in FIG. 1, and the dashed line represents results of a conventional display panel. Specifically, the solid line represents the results of the display panel having the pixel array 110 in FIG. 2. Particularly, the pixel structure 113 corresponding to the blue sub-pixel region has a pixel electrode which is divided into the pixel electrode P3 having a larger area and the pixel electrode P4 having a smaller area. By contrast, the conventional display panel represented by the dashed line has a pixel array formed by repeatedly arranging, e.g., the pixel structure 111 in FIG. 2. As shown in FIG. 3, at a higher gray level, the display panel in FIG. 1 according to an embodiment of the invention has a lower degree of color shift in a side view as compared to the conventional display panel.

Figure 4:
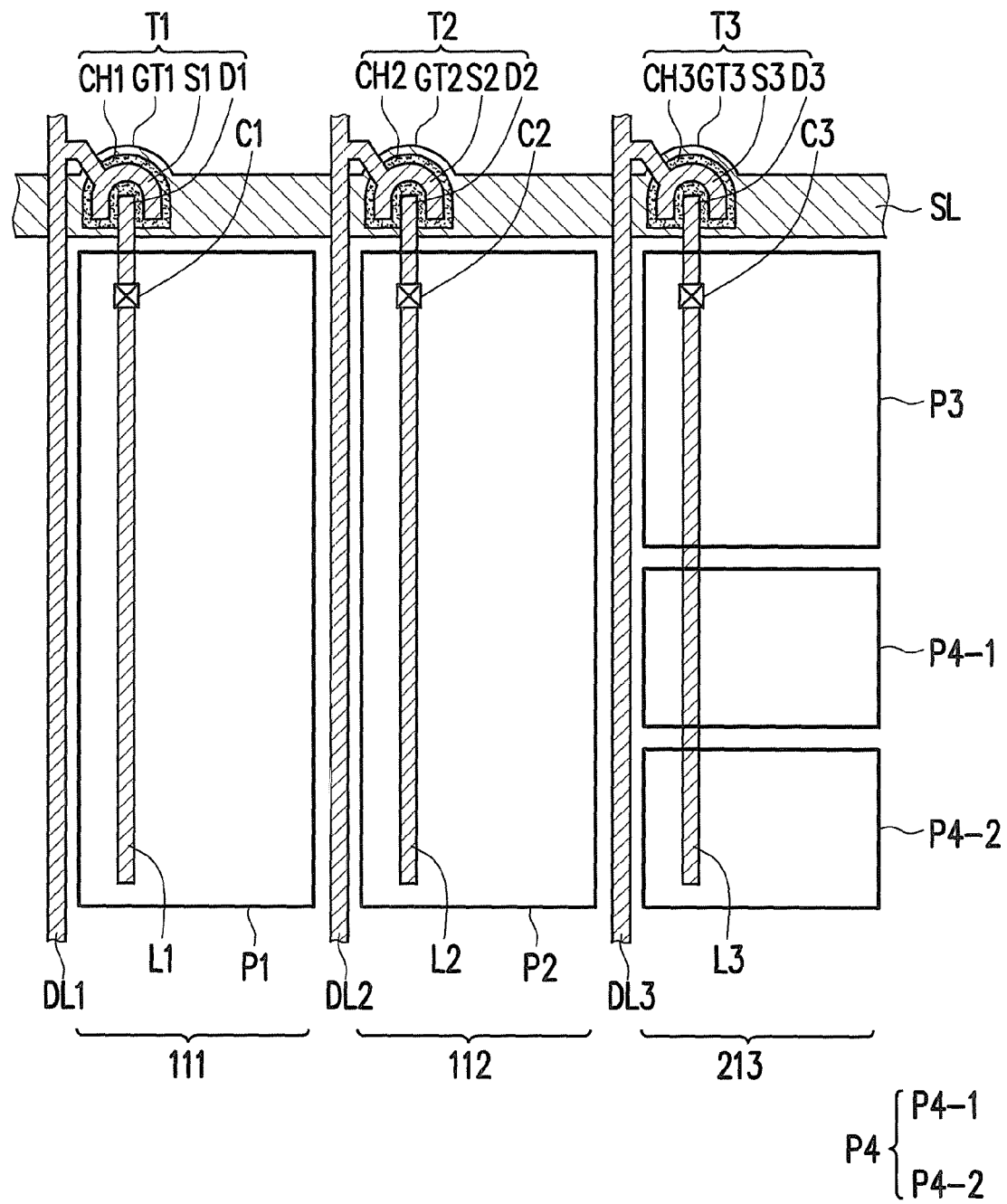
FIG. 4 is a schematic top view of a pixel array of the display panel in FIG. 1 according to another embodiment of the invention.

FIG. 4 is a schematic top view of a pixel array of the display panel in FIG. 1 according to another embodiment of the invention. Referring to FIG. 1 and FIG. 4 together, a pixel array 210 in FIG. 4 includes a plurality of pixel structures 111, 112 and 213. For clarity, FIG. 4 only illustrates one pixel structure 111, one pixel structure 112 and one pixel structure 213. However, it should be apparent to persons of ordinary skill in the art that the pixel array 210 may include even more pixel structures. In the present embodiment, the pixel structures 111, 112 and 213 respectively correspond to, e.g., a red sub-pixel region, a green sub-pixel region and a blue sub-pixel region, wherein in view of transmittance and brightness of the display panel 100, the pixel structure 213 preferably corresponds to the blue sub-pixel region. However, the invention is not limited thereto.

The pixel array 210 in FIG. 4 is similar to the pixel array 110 in FIG. 2. Thus, the same or similar elements are indicated by the same or similar reference numerals, and descriptions thereof are not repeated herein. A difference between the pixel array 210 and the pixel array 110 lies in the pixel structure 213 of the pixel array 210. The pixel structure 213 includes the scan line SL, the data line DL3, the active device T3, and the pixel electrodes P3 and P4. The pixel structure 213 is similar to the pixel structure 113 in FIG. 2. Thus, the same or similar elements are indicated by the same or similar reference numerals, and descriptions thereof are not repeated herein. It is worth mentioning that the pixel electrode P4 of the present embodiment has sub-electrodes P4-1 and P4-2 that are separate from each other. However, the invention is not limited thereto. The pixel electrode P4 may have even more separate sub-electrodes. As shown in FIG. 4, the sub-electrodes P4-1 and P4-2 are located on the same side of the pixel electrode P3. However, in other embodiments, the sub-electrodes P4-1 and P4-2 may be located on two opposite sides of the pixel electrode P3.

As shown in FIG. 4, the pixel electrode P3 is correspondingly electrically connected to the active device T3. In detail, the drain D3 and the conductive line L3 are connected to each other. In the present embodiment, the drain D3 and the conductive line L3 are located in the same layer. However, the invention is not limited thereto. The conductive line L3 is located below the pixel electrodes P3 and P4, and the contact C3 is disposed between the conductive line L3 and the pixel electrode P3. The active device T3 is electrically connected to the pixel electrode P3 through the contact C3.

Referring to FIG. 1 and FIG. 4 together, in the present embodiment, the pixel electrodes P3 and P4 are electrodes having a block pattern. However, the invention is not limited thereto. In other embodiments, the pixel electrodes P3 and P4 may be electrodes having other specific patterns, including a plurality of V-shaped branch portions or pixel electrodes having a Union Jack-like pattern or other patterns (not illustrated). For example, in the case where the pixel electrodes P3 and P4 are pixel electrodes having a Union Jack-like pattern, twelve alignment domain regions are formed in the pixel structure 213, such that a plurality of liquid crystal molecules in the display medium 30 are tilted along twelve alignment directions (not illustrated).

Particularly, the pixel electrode P3 is electrically connected to the active device T3, and the sub-electrodes P4-1 and P4-2 of the pixel electrode P4 are electrically insulated from the pixel electrode P3. In detail, the drain D3 of the active device T3 and the conductive line L3 are connected to each other. In the present embodiment, the drain D3 and the conductive line L3 are located in the same layer. However, the invention is not limited thereto. The conductive line L3 is located below the pixel electrode P3, the sub-electrodes P4-1 and P4-2, and the contact C3 is formed between the conductive line L3 and the pixel electrode P3. The active device T3 is electrically connected to the pixel electrode P3 through the contact C3. In addition, the conductive line L3 is coupled to the sub-electrode P4-1 of the pixel electrode P4 to form a first sub-additional capacitance, and the conductive line L3 is coupled to the sub-electrode P4-2 of the pixel electrode P4 to form a second sub-additional capacitance. The pixel electrode P3, the sub-electrode P4-1 of the pixel electrode P4 and the sub-electrode P4-2 of the pixel electrode P4 respectively have voltages $V_{P3'}$, $V_{P4-1}$ and $V_{P4-2}$.

It is worth mentioning that, in the present embodiment, by dividing a pixel electrode of the pixel structure 213 that corresponds to the blue sub-pixel region into the pixel electrode P3 having a larger area and the sub-electrodes P4-1 and P4-2 having a smaller area, and through the above-mentioned coupled driving design, the blue sub-pixel region is provided with the three different pixel voltages $V_{P3'}$, $V_{P4-1}$ and $V_{P4-2}$, thereby producing different brightnesses. In this way, the color shift in a side view of pixels at a high gray level is reduced. In addition, the blue sub-pixel region itself is oversaturated. Even if the sub-electrodes P4-1 and P4-2 having the lower voltages $V_{P4-1}$ and $V_{P4-2}$ are separately formed, the resulting reduction in brightness is little. Moreover, the blue color contributes very little to the brightness. Therefore, the design of the pixel structure 213 has a minor impact on transmittance of the display panel. Based on calculation results, a ratio of an area of the pixel electrode P3 to an area of the sub-electrode P4-1 to an area of the sub-electrode P4-2 is preferably 3:1:1, and a voltage ratio $V_{P3'}/N_{P4-1}/V_{P4-2}$ of the pixel electrode P3 to the sub-electrode P4-1 to the sub-electrode P4-2 is preferably 2.85:2.5:2.1.

Figure 5:
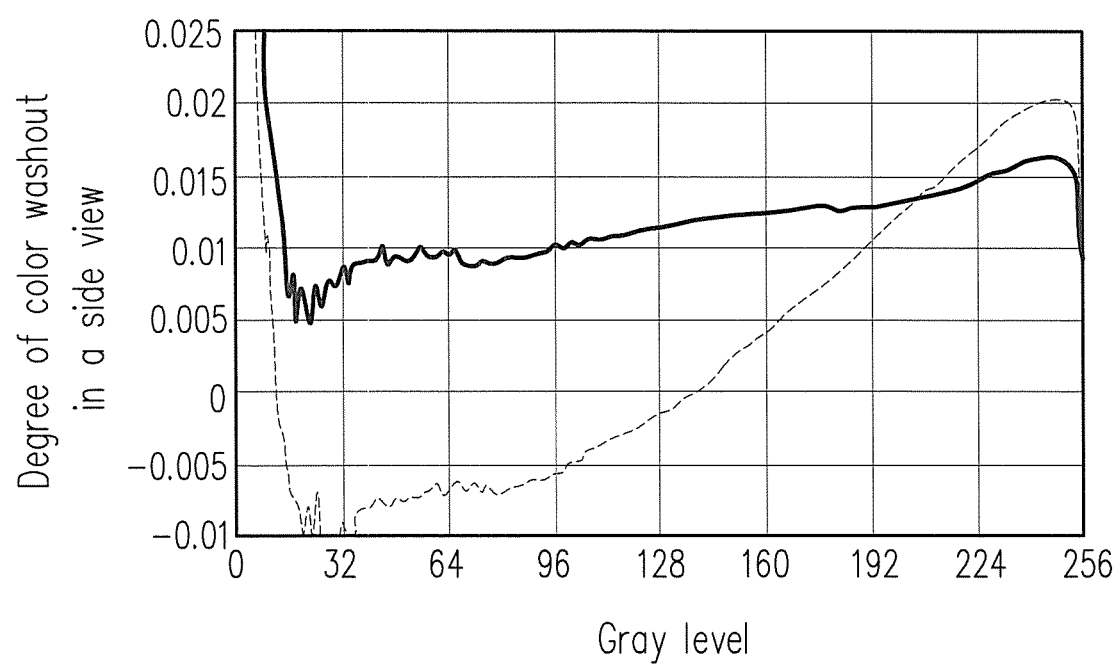
FIG. 5 illustrates a relationship between gray level and color shift in a side view in the display panel according to the embodiment of FIG. 4.

FIG. 5 illustrates a relationship between gray level and color shift in a side view in the display panel according to the embodiment of FIG. 4. The horizontal axis indicates the gray level, and the vertical axis indicates degree of color shift in a side view. The solid line represents results of the display panel in FIG. 1 with the pixel array of FIG. 4, and the dashed line represents results of a conventional display panel. Specifically, the solid line represents the results of the display panel having the pixel array 210 in FIG. 4. Particularly, the pixel array 210 includes the pixel structure 213 that corresponds to the blue sub-pixel region, and a pixel electrode of the pixel structure 213 is divided into the pixel electrode P3 having a larger area and the two sub-electrodes P4-1 and P4-2 having a smaller area. By contrast, the conventional display panel represented by the dashed line has a pixel array formed by repeatedly arranging, e.g., the pixel structure 111 in FIG. 4. As shown in FIG. 5, at a higher gray level, the display panel according to the embodiment of FIG. 4 has a lower degree of color shift in a side view as compared to the conventional display panel.

Figure 6:
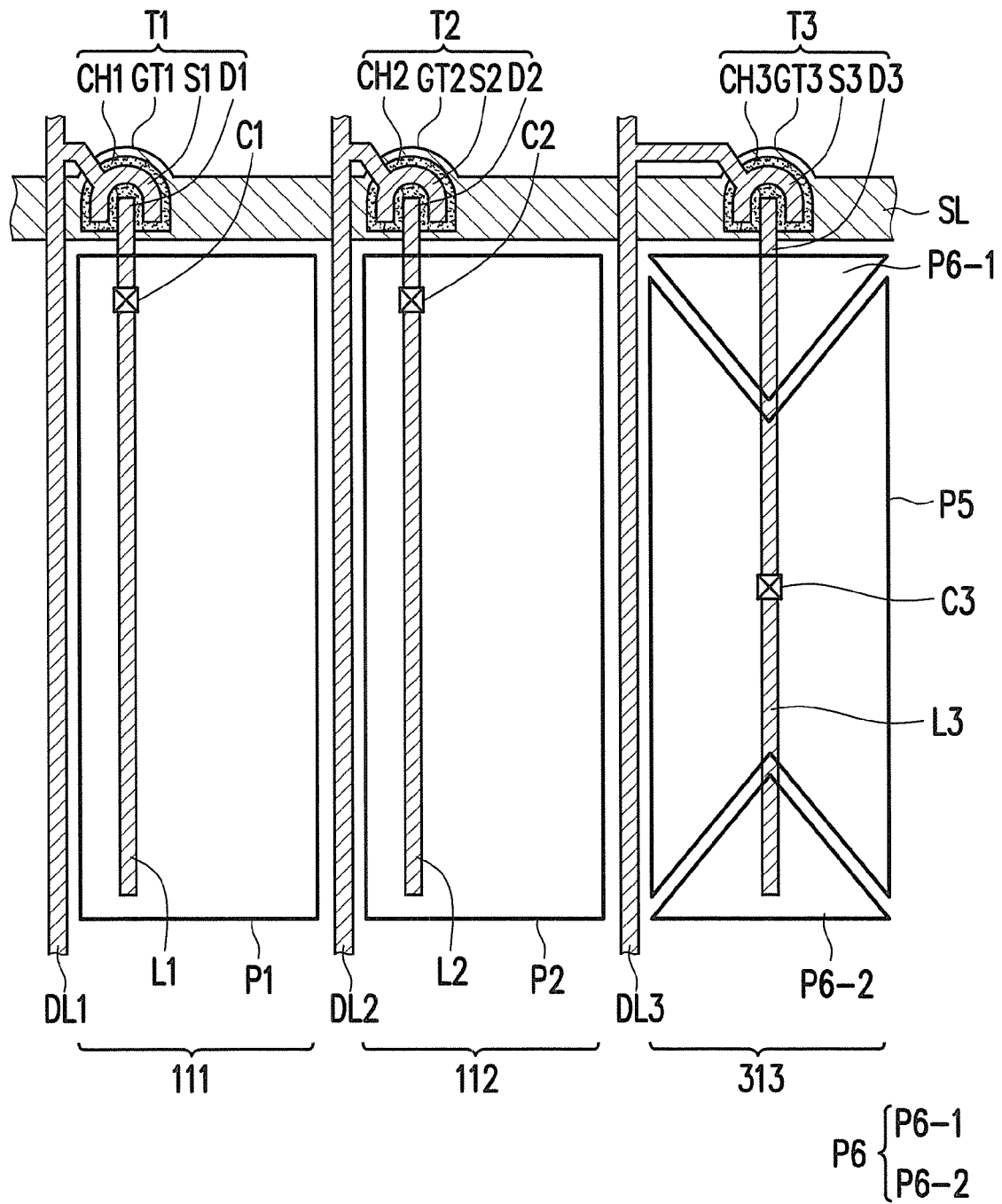
FIG. 6 is a schematic top view of a pixel array of the display panel in FIG. 1 according to still another embodiment of the invention.

FIG. 6 is a schematic top view of a pixel array of the display panel in FIG. 1 according to still another embodiment of the invention. Referring to FIG. 1 and FIG. 6 together, a pixel array 310 in FIG. 6 includes a plurality of pixel structures 111, 112 and 313. For clarity, FIG. 6 only illustrates one pixel structure 111, one pixel structure 112 and one pixel structure 313. However, it should be apparent to persons of ordinary skill in the art that the pixel array 310 may include even more pixel structures. In the present embodiment, the pixel structures 111, 112 and 313 respectively correspond to, e.g., a red sub-pixel region, a green sub-pixel region and a blue sub-pixel region, wherein in view of transmittance and brightness of the display panel 100, the pixel structure 313 preferably corresponds to the blue sub-pixel region. However, the invention is not limited thereto.

The pixel array 310 in FIG. 6 is similar to the pixel array 110 in FIG. 2. Thus, the same or similar elements are indicated by the same or similar reference numerals, and descriptions thereof are not repeated herein. A difference between the pixel array 310 and the pixel array 110 lies in the pixel structure 313 of the pixel array 310. The pixel structure 313 includes the scan line SL, the data line DL3, the active device T3, and pixel electrodes P5 and P6. The pixel structure 313 is similar to the pixel structure 113 in FIG. 2. Thus, the same or similar elements are indicated by the same or similar reference numerals, and descriptions thereof are not repeated herein. It is worth mentioning that the pixel electrode P6 of the present embodiment has sub-electrodes P6-1 and P6-2 that are separate from each other. However, the invention is not limited thereto. The pixel electrode P6 may have even more separate sub-electrodes.

Particularly, the pixel electrode P5 is electrically connected to the active device T3, and the sub-electrodes P6-1 and P6-2 of the pixel electrode P6 are electrically insulated from the pixel electrode P5. In detail, the drain D3 of the active device T3 and the conductive line L3 are connected to each other. In the present embodiment, the drain D3 and the conductive line L3 are located in the same layer. However, the invention is not limited thereto. The conductive line L3 is located below the pixel electrode P5, the sub-electrode P6-1 and the sub-electrode P6-2, and the contact C3 is formed between the conductive line L3 and the pixel electrode P5. The active device T3 is electrically connected to the pixel electrode P5 through the contact C3. In addition, the conductive line L3 is coupled to the sub-electrode P6-1 of the pixel electrode P6 to form the first sub-additional capacitance, and the conductive line L3 is coupled to the sub-electrode P6-2 of the pixel electrode P6 to form the second sub-additional capacitance.

Referring to FIG. 4 and FIG. 6 together, a difference between the embodiments of FIG. 4 and FIG. 6 is as follows. In FIG. 4, the two sub-electrodes P4-1 and P4-2 are located on the same side of the pixel electrode P3, while in FIG. 6, the two sub-electrodes P6-1 and P6-2 are located on two opposite sides of the pixel electrode P5. In addition, as shown in FIG. 6, the two sub-electrodes P6-1 and P6-2 are electrodes having a triangular pattern, and the pixel electrode P5 is an electrode having a polygonal pattern. This increases the first sub-additional capacitance and the second sub-additional capacitance formed by coupling the conductive line L3 to the sub-electrodes P6-1 and P6-2 respectively, so as to reduce the color shift in a side view of the display panel. However, in other embodiments, the sub-electrodes P6-1 and P6-2 and the pixel electrode P5 may be electrodes having other patterns.

Figure 7:
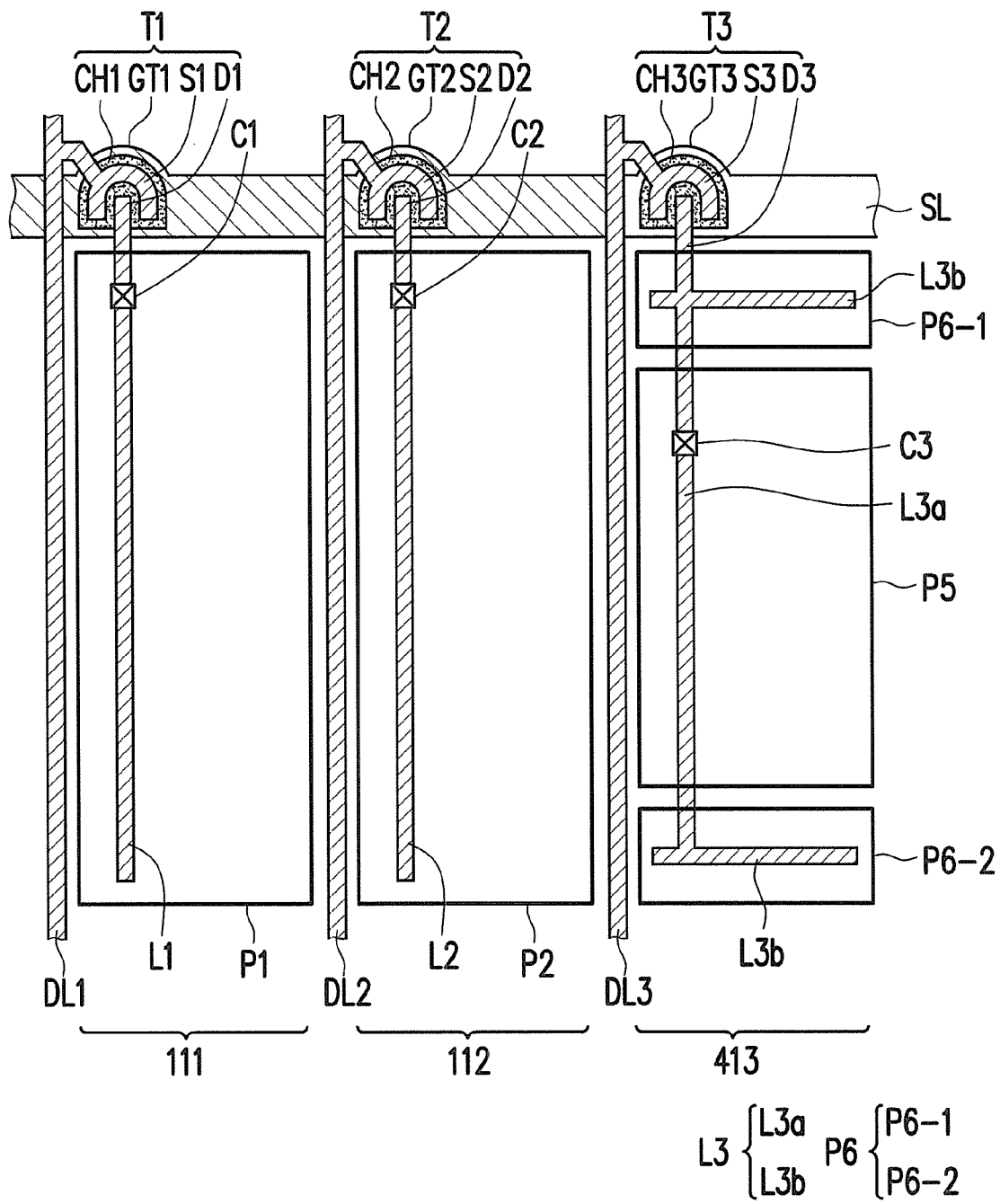
FIG. 7 is a schematic top view of a pixel array of the display panel in FIG. 1 according to yet still another embodiment of the invention.

FIG. 7 is a schematic top view of a pixel array of the display panel in FIG. 1 according to yet still another embodiment of the invention. Referring to FIG. 1 and FIG. 7 together, a pixel array 410 in FIG. 7 includes a plurality of pixel structures 111, 112 and 413. For clarity, FIG. 7 only illustrates one pixel structure 111, one pixel structure 112 and one pixel structure 413. However, it should be apparent to persons of ordinary skill in the art that the pixel array 410 may include even more pixel structures. In the present embodiment, the pixel structures 111, 112 and 413 respectively correspond to, e.g., a red sub-pixel region, a green sub-pixel region and a blue sub-pixel region, wherein in view of transmittance and brightness of the display panel 100, the pixel structure 413 preferably corresponds to the blue sub-pixel region. However, the invention is not limited thereto.

The pixel array 410 in FIG. 7 is similar to the pixel array 110 in FIG. 2. Thus, the same or similar elements are indicated by the same or similar reference numerals, and descriptions thereof are not repeated herein. A difference between the pixel array 410 and the pixel array 110 lies in the pixel structure 413 of the pixel array 410. The pixel structure 413 includes the scan line SL, the data line DL3, the active device T3, and the pixel electrodes P5 and P6. The pixel structure 413 in FIG. 7 is similar to the pixel structure 113 in FIG. 2. Thus, the same or similar elements are indicated by the same or similar reference numerals, and descriptions thereof are not repeated herein. It is worth mentioning that the pixel electrode P6 of the present embodiment has the sub-electrodes P6-1 and P6-2 that are separate from each other. However, the invention is not limited thereto. The pixel electrode P6 may have even more separate sub-electrodes. As shown in FIG. 7, the sub-electrodes P6-1 and P6-2 are located on two opposite sides of the pixel electrode P5. However, in other embodiments, the sub-electrodes P6-1 and P6-2 may be located on the same side of the pixel electrode P5.

Particularly, the pixel electrode P5 is electrically connected to the active device T3, and the sub-electrodes P6-1 and P6-2 of the pixel electrode P6 are electrically insulated from the pixel electrode P5. In detail, the drain D3 of the active device T3 and the conductive line L3 are connected to each other. In the present embodiment, the drain D3 and the conductive line L3 are located in the same layer. However, the invention is not limited thereto. The conductive line L3 is located below the pixel electrode P5, the sub-electrode P6-1 and the sub-electrode P6-2, and the contact C3 is formed between the conductive line L3 and the pixel electrode P5. The active device T3 is electrically connected to the pixel electrode P5 through the contact C3. In addition, the conductive line L3 is coupled to the sub-electrode P6-1 of the pixel electrode P6 to form the first sub-additional capacitance, and the conductive line L3 is coupled to the sub-electrode P6-2 of the pixel electrode P6 to form the second sub-additional capacitance.

Referring to FIG. 4 and FIG. 7 together, a difference between the embodiments of FIG. 4 and FIG. 7 is as follows. In FIG. 4, the two sub-electrodes P4-1 and P4-2 are located on the same side of the pixel electrode P3, while in FIG. 7, the two sub-electrodes P6-1 and P6-2 are located on two opposite sides of the pixel electrode P5. Particularly, as shown in FIG. 7, the conductive line L3 includes a main portion L3a and branch portions L3b. The main portion L3a is disposed overlapping the pixel electrode P5. The branch portions L3b extend from the main portion L3a. In the present embodiment, the conductive line L3 has two branch portions L3b respectively disposed overlapping the sub-electrodes P6-1 and P6-2 of the pixel electrode P6. However, the invention is not limited thereto. As shown in FIG. 7, the conductive line L3 is formed in a double-cross shape. By disposing the double-cross shaped conductive line L3 in a manner overlapping the pixel electrode P5 and the sub-electrodes P6-1 and P6-2, the first sub-additional capacitance and the second sub-additional capacitance formed by coupling the conductive line L3 to the sub-electrodes P6-1 and P6-2 respectively are considerably increased, so as to reduce the color shift in a side view of the display panel.

Figure 8:
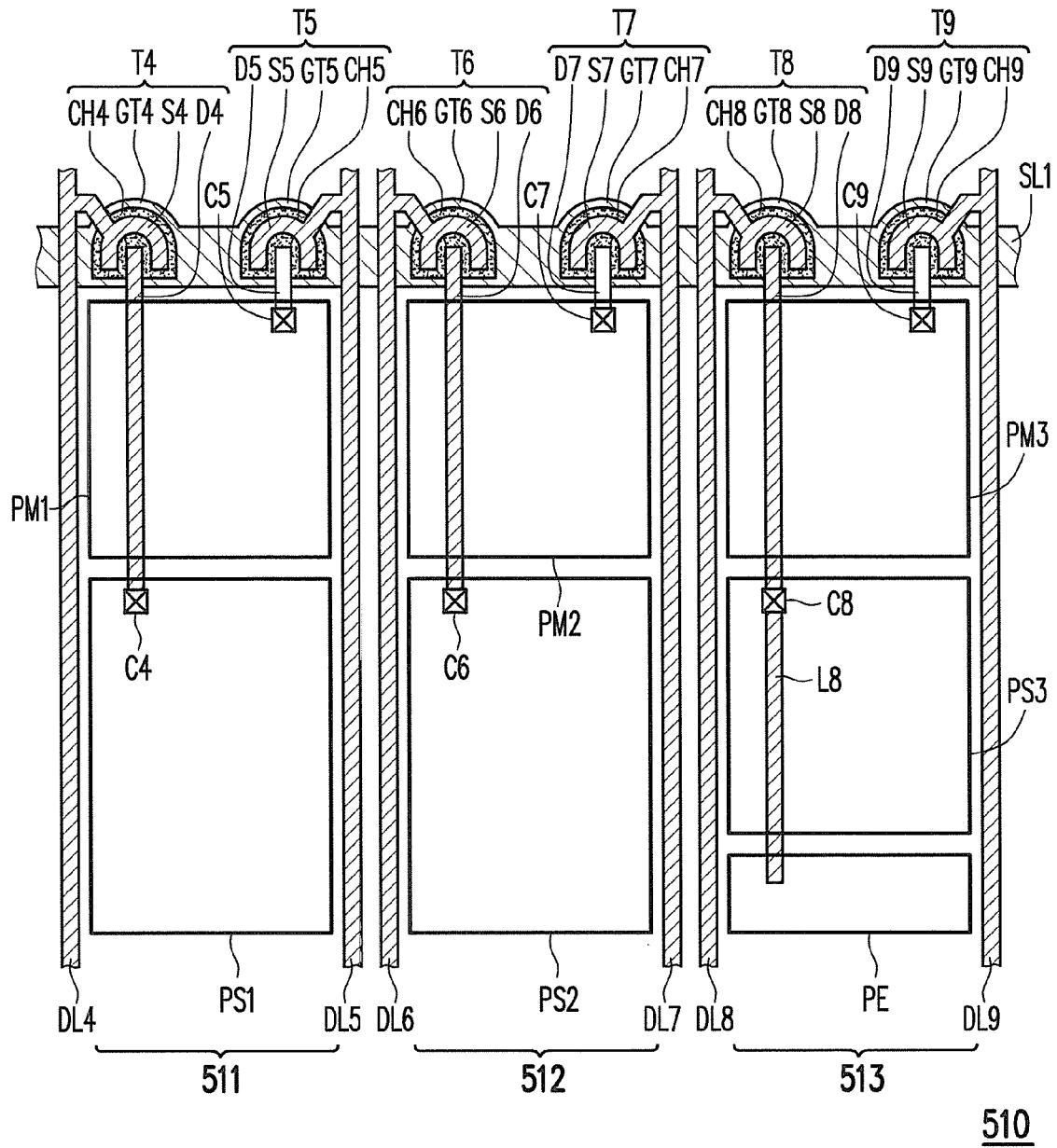
FIG. 8 is a schematic top view of a pixel array of the display panel in FIG. 1 according to another embodiment of the invention.

FIG. 8 is a schematic top view of a pixel array of the display panel in FIG. 1 according to another embodiment of the invention. A pixel array 510 in FIG. 8 includes a plurality of pixel structures 511, 512 and 513. For clarity, FIG. 8 only illustrates one pixel structure 511, one pixel structure 512 and one pixel structure 513. However, it should be apparent to persons of ordinary skill in the art that the pixel array 510 may include even more pixel structures. In the present embodiment, the pixel structures 511, 512 and 513 respectively correspond to, e.g., a red sub-pixel region, a green sub-pixel region and a blue sub-pixel region, wherein in view of transmittance and brightness of the display panel 100, the pixel structure 513 preferably corresponds to the blue sub-pixel region. However, the invention is not limited thereto.

The pixel structure 511 includes a scan line SL1, data lines DL4 and DL5, active devices T4 and T5, and pixel electrodes PM1 and PS1.

An extension direction of the scan line SL1 is different from extension directions of the data lines DL4 and DL5. It is preferred that the extension direction of the scan line SL1 is perpendicular to the extension directions of the data lines DL4 and DL5. In addition, the scan line SL1 and the data lines DL4 and DL5 are located in different layers, and sandwich an insulating layer (not illustrated) therebetween. The scan line SL1 and the data lines DL4 and DL5 are mainly configured to transmit a driving signal for driving the pixel structure 511. In view of conductivity, the scan line SL1 and the data lines DL4 and DL5 are generally made of metal materials. However, the invention is not limited thereto. According to other embodiments, the scan line SL1 and the data lines DL4 and DL5 may also be made of other conductive materials, such as alloys, metal oxides, metal nitrides, metal oxynitrides or stacked layers of metal materials and other conductive materials.

In the pixel structure 511, the active device T4 is electrically connected to the scan line SL1 and the data line DL4, and the active device T5 is electrically connected to the scan line SL1 and the data line DL5. Here, the active device T4 is, e.g., a thin film transistor, and includes a gate GT4, a channel layer CH4, a drain D4 and a source S4. Similarly, the active device T5 includes, e.g., a gate GT5, a channel layer CH5, a drain D5 and a source S5. The gates GT4 and GT5 are each electrically connected to the scan line SL1. In the pixel structure 511, the source S4 is electrically connected to the data line DL4, and the source S5 is electrically connected to the data line DL5. The channel layer CH4 is located above the gate GT4 and below the source S4 and the drain D4, and the channel layer CH5 is located above the gate GT5 and below the source S5 and the drain D5. The present embodiment provides an example where the active devices T4 and T5 are bottom-gate thin film transistors. However, the invention is not limited thereto. In other embodiments, the active devices T4 and T5 may be top-gate thin film transistors.

As shown in FIG. 8, in the pixel structure 511, the pixel electrode PM1 is electrically connected to the active device T5, and the pixel electrode PS1 is electrically connected to the active device T4. In detail, a contact C4 is disposed between the drain D4 and the pixel electrode PS1. A contact C5 is disposed between the drain D5 and the pixel electrode PM1. The active device T4 is electrically connected to the pixel electrode PS1 through the contact C4, and the active device T5 is electrically connected to the pixel electrode PM1 through the contact C5. The pixel electrodes PM1 and PS1 are, e.g., transparent conductive layers, and include metal oxides, such as indium tin oxide, indium zinc oxide, aluminum tin oxide, aluminum zinc oxide, indium germanium zinc oxide or other suitable oxides, or stacked layers of at least two of the above.

Referring to FIG. 1 and FIG. 8 together, in the present embodiment, the pixel electrodes PM1 and PS1 are electrodes having a block pattern. However, the invention is not limited thereto. In other embodiments, the pixel electrodes PM1 and PS1 may be electrodes having other specific patterns, including a plurality of V-shaped branch portions or pixel electrodes having a Union Jack-like pattern or other patterns (not illustrated). For example, in the case where the pixel electrodes PM1 and PS1 are pixel electrodes having a Union Jack-like pattern, eight alignment domain regions are formed in the pixel structure 511, such that a plurality of liquid crystal molecules in the display medium 30 are tilted along eight alignment directions (not illustrated).

Similarly, the pixel structure 512 includes the scan line SL1, data lines DL6 and DL7, active devices T6 and T7, and pixel electrodes PM2 and PS2.

The extension direction of the scan line SL1 is different from extension directions of the data lines DL6 and DL7. It is preferred that the extension direction of the scan line SL1 is perpendicular to the extension directions of the data lines DL6 and DL7. In addition, the scan line SL1 and the data lines DL6 and DL7 are located in different layers, and sandwich an insulating layer (not illustrated) therebetween. The scan line SL1 and the data lines DL6 and DL7 are mainly configured to transmit a driving signal for driving the pixel structure 512. In view of conductivity, the scan line SL1 and the data lines DL6 and DL7 are generally made of metal materials. However, the invention is not limited thereto. According to other embodiments, the scan line SL1 and the data lines DL6 and DL7 may also be made of other conductive materials, such as alloys, metal oxides, metal nitrides, metal oxynitrides or stacked layers of metal materials and other conductive materials.

In the pixel structure 512, the active device T6 is electrically connected to the scan line SL1 and the data line DL6, and the active device T7 is electrically connected to the scan line SL1 and the data line DL7. Here, the active device T6 is, e.g., a thin film transistor, and includes a gate GT6, a channel layer CH6, a drain D6 and a source S6. Similarly, the active device T7 includes, e.g., a gate GT7, a channel layer CH7, a drain D7 and a source S7. The gates GT6 and GT7 are each electrically connected to the scan line SL1. In the pixel structure 512, the source S6 is electrically connected to the data line DL6, and the source S7 is electrically connected to the data line DL7. The channel layer CH6 is located above the gate GT6 and below the source S6 and the drain D6, and the channel layer CH7 is located above the gate GT7 and below the source S7 and the drain D7. The present embodiment provides an example where the active devices T6 and T7 are bottom-gate thin film transistors. However, the invention is not limited thereto. In other embodiments, the active devices T6 and T7 may be top-gate thin film transistors.

As shown in FIG. 8, in the pixel structure 512, the pixel electrode PM2 is electrically connected to the active device T7, and the pixel electrode PS2 is electrically connected to the active device T6. In detail, a contact C6 is disposed between the drain D6 and the pixel electrode PS2. A contact C7 is disposed between the drain D7 and the pixel electrode PM2. The active device T6 is electrically connected to the pixel electrode PS2 through the contact C6, and the active device T7 is electrically connected to the pixel electrode PM2 through the contact C7. The pixel electrodes PM2 and PS2 are, e.g., transparent conductive layers, and include metal oxides, such as indium tin oxide, indium zinc oxide, aluminum tin oxide, aluminum zinc oxide, indium germanium zinc oxide or other suitable oxides, or stacked layers of at least two of the above.

Referring to FIG. 1 and FIG. 8 together, in the present embodiment, the pixel electrodes PM2 and PS2 are electrodes having a block pattern. However, the invention is not limited thereto. In other embodiments, the pixel electrodes PM2 and PS2 may be electrodes having other specific patterns, including a plurality of V-shaped branch portions or pixel electrodes having a Union Jack-like pattern or other patterns (not illustrated). For example, in the case where the pixel electrodes PM2 and PS2 are pixel electrodes having a Union Jack-like pattern, eight alignment domain regions are formed in the pixel structure 512, such that a plurality of liquid crystal molecules in the display medium 30 are tilted along eight alignment directions (not illustrated).

It is worth mentioning that in the present embodiment, the pixel structures 511 and 512 respectively have the pixel electrodes PM1 and PM2 (also referred to as main pixel electrodes) having a smaller area, and the pixel electrodes PS1 and PS2 (also referred to as sub-pixel electrodes) having a larger area. In the pixel structure 511, the pixel electrodes PM1 and PS1 respectively have voltages $V_{PM1}$ and $V_{PS1}$. Based on calculation results, a ratio of an area of the pixel electrode PM1 to an area of the pixel electrode PS1 is preferably 1:2, and a voltage ratio $V_{PM1}/V_{PS1}$ of the pixel electrode PM1 to the pixel electrode PS1 is preferably 2.85:2.1. Similarly, in the pixel structure 512, the pixel electrodes PM2 and PS2 respectively have voltages $V_{PM2}$ and $V_{PS2}$. Based on calculation results, a ratio of an area of the pixel electrode PM2 to an area of the pixel electrode PS2 is preferably 1:2, and a voltage ratio $V_{PM2}/V_{PS2}$ of the pixel electrode PM2 to the pixel electrode PS2 is preferably 2.85:2.1.

The pixel structure 513 includes the scan line SL1, data lines DL8 and DL9, active devices T8 and T9, and pixel electrodes PM3, PS3 and PE, wherein the pixel electrode PE is also referred to as a main pixel electrode, and the pixel electrode PS3 is also referred to as a sub-pixel electrode. The same or similar elements of the pixel structure 513 are indicated by the same or similar reference numerals as those of the pixel structures 511 and 512, and descriptions thereof are not repeated herein. It is worth mentioning that the pixel electrodes PM3, PS3 and PE of the pixel structure 513 do not directly contact one another.

In the present embodiment, the pixel electrodes PM3, PS3 and PE are electrodes having a block pattern. However, the invention is not limited thereto. In other embodiments, the pixel electrodes PM3, PS3 and PE may be electrodes having other specific patterns, including a plurality of V-shaped branch portions or pixel electrodes having a Union Jack-like pattern or other patterns (not illustrated). For example, in the case where the pixel electrodes PM3, PS3 and PE are pixel electrodes having a Union Jack-like pattern, twelve alignment domain regions are formed in the pixel structure 513, such that a plurality of liquid crystal molecules in the display medium 30 are tilted along twelve alignment directions (not illustrated).

Particularly, the pixel electrode PS3 is electrically connected to the active device T8, and the pixel electrode PM3 is electrically connected to the active device T9. The pixel electrodes PM3, PS3 and PE are electrically insulated from one another. In detail, a drain D8 of the active device T8 and a conductive line L8 are connected to each other, and a contact C8 is disposed between the conductive line L8 and the pixel electrode PS3. The active device T8 is electrically connected to the pixel electrode PS3 through the contact C8. In addition, the conductive line L8 is coupled to the pixel electrode PE to form a coupling capacitance. A contact C9 is disposed between a drain D9 of the active device T9 and the pixel electrode PM3. The active device T9 is electrically connected to the pixel electrode PM3 through the contact C9. The pixel electrodes PM3, PS3 and PE respectively have voltages $V_{PM3}$, $V_{PS3}$ and $V_{PE}$.

It is worth mentioning that, in the present embodiment, by dividing a pixel electrode of the pixel structure 513 that corresponds to the blue sub-pixel region into the pixel electrodes PM3, PS3 and PE, and through the above-mentioned coupled driving design, the blue sub-pixel region is provided with the three different pixel voltages $V_{PM3}$, $V_{PS3}$ and $V_{PE}$, thereby producing different brightnesses. In this way, the color shift in a side view of pixels at a high gray level is reduced. In addition, the blue sub-pixel region itself is oversaturated. Even if the pixel electrode PS3 having the lower voltage $V_{PS3}$ and the sub-pixel electrode PE having the lower voltage $V_{PE}$ are separately formed, the resulting reduction in brightness is little. Moreover, the blue color contributes very little to the brightness. Therefore, the design of the pixel structure 513 has a minor impact on transmittance of the display panel. Based on calculation results, a ratio of an area of the pixel electrode PM3 to a sum of areas of the pixel electrodes PS3 and PE is preferably 1:2, and a ratio of the area of the pixel electrode PS3 to the area of the pixel electrode PE is preferably 4:1. In addition, a voltage ratio $V_{PM3}/V_{PS3}$ of the pixel electrode PM3 to the pixel electrode PS3 is preferably 2.85:2.2, and a voltage ratio $V_{PS3}/V_{PE}$ of the pixel electrode PS3 to the pixel electrode PE is preferably 2.85:2.3.

Figure 9:
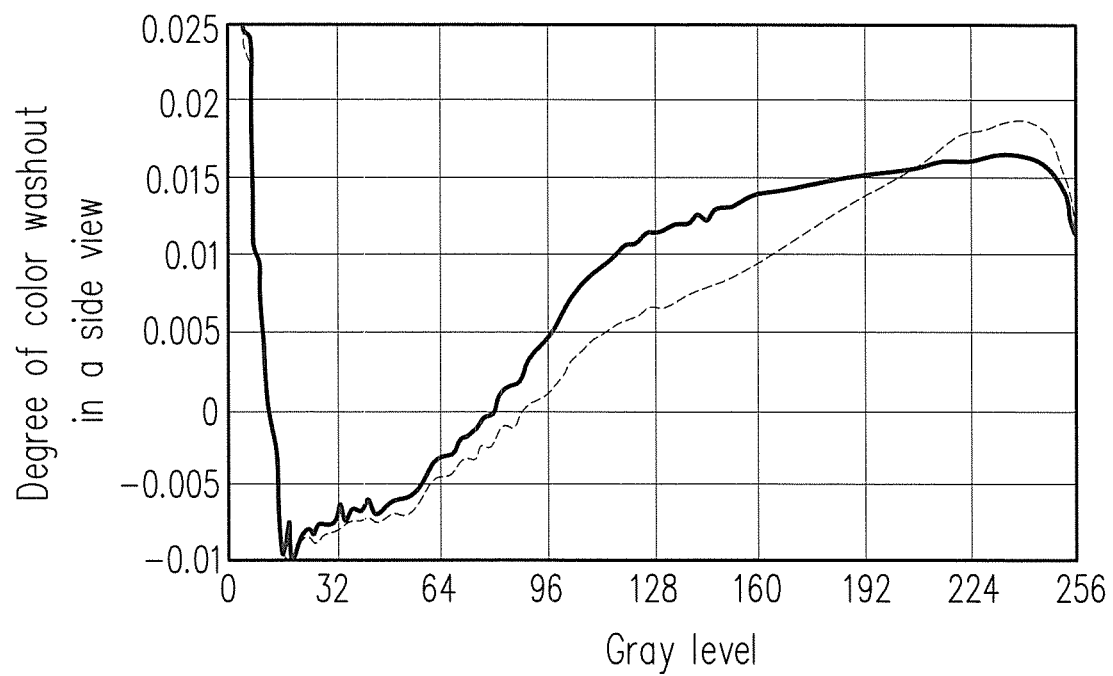
FIG. 9 illustrates a relationship between gray level and color shift in a side view in the display panel according to the embodiment of FIG. 8.

FIG. 9 illustrates a relationship between gray level and color shift in a side view in the display panel according to the embodiment of FIG. 8. The horizontal axis indicates the gray level, and the vertical axis indicates degree of color shift in a side view. The solid line represents results of the display panel in FIG. 8, and the dashed line represents results of a conventional display panel. Specifically, the solid line represents the results of the display panel having the pixel array 510 in FIG. 8. Particularly, the pixel array 510 includes the pixel structure 513 that corresponds to the blue sub-pixel region, and a pixel electrode of the pixel structure 513 is divided into the pixel electrodes PM3, PS3 and PE. By contrast, the conventional display panel represented by the dashed line has a pixel array formed by repeatedly arranging, e.g., the pixel structure 111 in FIG. 4. As shown in FIG. 9, at a higher gray level, the display panel according to the embodiment of FIG. 8 has a lower degree of color shift in a side view as compared to the conventional display panel.

In the embodiment of FIG. 8, the pixel structures 511, 512 and 513 in the pixel array 510 are pixel structures having a main pixel electrode and a sub-pixel electrode, wherein each of the pixel structures is driven by two data lines and one scan line. Accordingly, the main pixel electrode and the sub-pixel electrode are provided with different voltages, such that the color shift in a side view of the display panel is reduced. The pixel structures 511, 512 and 513 in the pixel array 510 in FIG. 8 are also referred to as 2D1G pixel structures. Actually, in the case where a pixel structure is designed to include a main pixel electrode and a sub-pixel electrode that have different voltages, the pixel structure may be a pixel structure of other types. For example, by disposing a shared switch element and a shared capacitor, the main pixel electrode and the sub-pixel electrode are provided with different voltages. Since the above-mentioned pixel structure that includes a shared switch element and a shared capacitor is a prior-art pixel structure for solving the color shift problem, descriptions thereof will be omitted herein.

Figure 10:
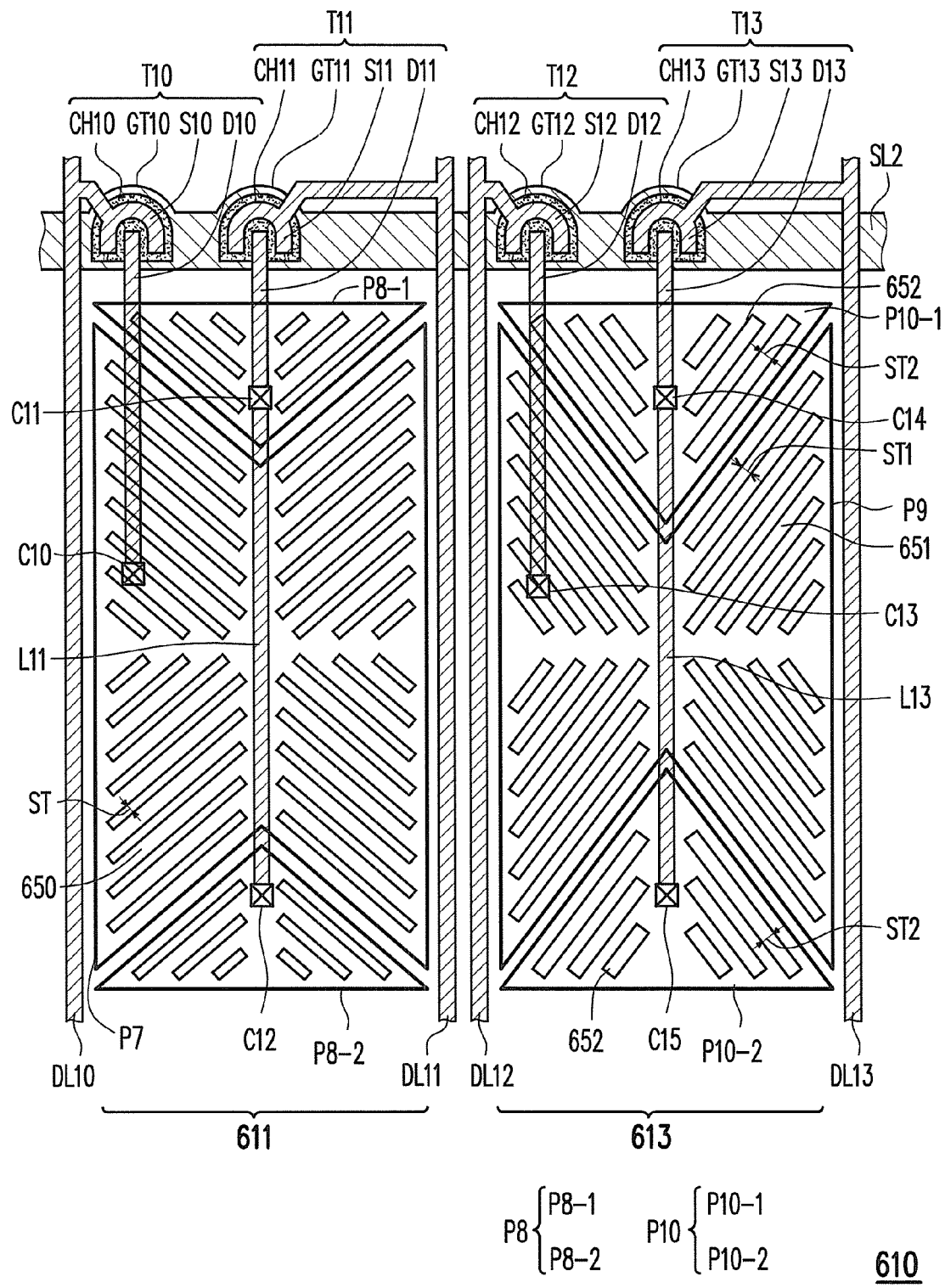
FIG. 10 is a schematic top view of a pixel array of the display panel in FIG. 1 according to still another embodiment of the invention.

FIG. 10 is a schematic top view of a pixel array of the display panel in FIG. 1 according to still another embodiment of the invention. Referring to FIG. 1 and FIG. 10 together, a pixel array 610 in FIG. 10 includes a plurality of pixel structures 611 and 613. For clarity, FIG. 10 only illustrates one pixel structure 611 and one pixel structure 613. However, it should be apparent to persons of ordinary skill in the art that the pixel array 610 may include even more pixel structures. In the present embodiment, the pixel structures 611 and 613 respectively correspond to, e.g., a red sub-pixel region and a blue sub-pixel region, wherein in view of transmittance and brightness of the display panel 100, the pixel structure 613 preferably corresponds to the blue sub-pixel region. However, the invention is not limited thereto.

The pixel structure 611 includes a scan line SL2, data lines DL10 and DL11, active devices T10 and T11, a pixel electrode P7 (also referred to as a main pixel electrode), and a pixel electrode P8, wherein the pixel electrode P8 includes two sub-pixel electrodes P8-1 and P8-2. It is to be noted that the sub-pixel electrodes P8-1 and P8-2 of the present embodiment are located on two opposite sides of the pixel electrode P7. However, the invention is not limited thereto.

An extension direction of the scan line SL2 is different from extension directions of the data lines DL10 and DL11. It is preferred that the extension direction of the scan line SL2 is perpendicular to the extension directions of the data lines DL10 and DL11. In addition, the scan line SL2 and the data lines DL10 and DL11 are located in different layers, and sandwich an insulating layer (not illustrated) therebetween. The scan line SL2 and the data lines DL10 and DL11 are mainly configured to transmit a driving signal for driving the pixel structure 611. In view of conductivity, the scan line SL2 and the data lines DL10 and DL11 are generally made of metal materials. However, the invention is not limited thereto. According to other embodiments, the scan line SL2 and the data lines DL10 and DL11 may also be made of other conductive materials, such as alloys, metal oxides, metal nitrides, metal oxynitrides or stacked layers of metal materials and other conductive materials.

In the pixel structure 611, the active device T10 is electrically connected to the scan line SL2 and the data line DL10, and the active device T11 is electrically connected to the scan line SL2 and the data line DL11. Here, the active device T10 is, e.g., a thin film transistor, and includes a gate GT10, a channel layer CH10, a drain D10 and a source S10. Similarly, the active device T11 includes, e.g., a gate GT11, a channel layer CH11, a drain D11 and a source S11. The gates GT10 and GT11 are each electrically connected to the scan line SL2. In the pixel structure 611, the source S10 is electrically connected to the data line DL10, and the source S11 is electrically connected to the data line DL11. The channel layer CH10 is located above the gate GT10 and below the source S10 and the drain D10, and the channel layer CH11 is located above the gate GT11 and below the source S11 and the drain D11. The present embodiment provides an example where the active devices T10 and T11 are bottom-gate thin film transistors. However, the invention is not limited thereto. In other embodiments, the active devices T10 and T11 may be top-gate thin film transistors.

As shown in FIG. 10, in the pixel structure 611, the pixel electrode P7 is electrically connected to the active device T10, and the pixel electrode P8 is electrically connected to the active device T11. The pixel electrodes P7 and P8 are, e.g., transparent conductive layers, and include metal oxides, such as indium tin oxide, indium zinc oxide, aluminum tin oxide, aluminum zinc oxide, indium germanium zinc oxide or other suitable oxides, or stacked layers of at least two of the above.

As shown in FIG. 10, a contact C10 is disposed between the drain D10 of the active device T10 and the pixel electrode P7. The active device T10 is electrically connected to the main pixel electrode P7 through the contact C10. In addition, the sub-pixel electrodes P8-1 and P8-2 are correspondingly electrically connected to the active device T11. In detail, the drain D11 and a conductive line L11 are connected to each other, and contacts C11 and C12 are respectively disposed between the conductive line L11 and the sub-pixel electrode P8-1 and between the conductive line L11 and the sub-pixel electrode P8-2. The active device T11 is electrically connected to the sub-pixel electrodes P8-1 and P8-2 respectively through the contacts C11 and C12.

In the present embodiment, as shown in FIG. 10, the pixel electrodes P7 and P8 are both electrodes having a Union Jack-like pattern. In detail, the pixel electrodes P7 and P8 include a plurality of branch patterns 650. A slit width between adjacent branch patterns 650 is ST. It is to be noted that the pixel electrodes P7 and P8 have the branch patterns 650 having the same width.

Similarly, the pixel structure 613 includes the scan line SL2, data lines DL12 and DL13, active devices T12 and T13, a pixel electrode P9 (also referred to as a main pixel electrode), and a pixel electrode P10, wherein the pixel electrode P10 includes two sub-pixel electrodes P10-1 and P10-2. However, the invention is not limited thereto. In other embodiments, the pixel structures 611 and 613 may include even more sub-pixel electrodes. It is to be noted that the sub-pixel electrodes P10-1 and P10-2 of the present embodiment are located on two opposite sides of the pixel electrode P9. However, the invention is not limited thereto.

The extension direction of the scan line SL2 is different from extension directions of the data lines DL12 and DL13. It is preferred that the extension direction of the scan line SL2 is perpendicular to the extension directions of the data lines DL12 and DL13. In addition, the scan line SL2 and the data lines DL12 and DL13 are located in different layers, and sandwich an insulating layer (not illustrated) therebetween. The scan line SL2 and the data lines DL12 and DL13 are mainly configured to transmit a driving signal for driving the pixel structure 613. In view of conductivity, the scan line SL2 and the data lines DL12 and DL13 are generally made of metal materials. However, the invention is not limited thereto. According to other embodiments, the scan line SL2 and the data lines DL12 and DL13 may also be made of other conductive materials, such as alloys, metal oxides, metal nitrides, metal oxynitrides or stacked layers of metal materials and other conductive materials.

In the pixel structure 613, the active device T12 is electrically connected to the scan line SL2 and the data line DL12, and the active device T13 is electrically connected to the scan line SL2 and the data line DL13. Here, the active device T12 is, e.g., a thin film transistor, and includes a gate GT12, a channel layer CH12, a drain D12 and a source S12. Similarly, the active device T13 includes, e.g., a gate GT13, a channel layer CH13, a drain D13 and a source S13. The gates GT12 and GT13 are each electrically connected to the scan line SL2. In the pixel structure 613, the source S12 is electrically connected to the data line DL12, and the source S13 is electrically connected to the data line DL13. The channel layer CH12 is located above the gate GT12 and below the source S12 and the drain D12, and the channel layer CH13 is located above the gate GT13 and below the source S13 and the drain D13. The present embodiment provides an example where the active devices T12 and T13 are bottom-gate thin film transistors. However, the invention is not limited thereto. In other embodiments, the active devices T12 and T13 may be top-gate thin film transistors.

As shown in FIG. 10, in the pixel structure 613, the pixel electrode P9 is electrically connected to the active device T12, and the pixel electrode P10 is electrically connected to the active device T13. The pixel electrodes P9 and P10 are, e.g., transparent conductive layers, and include metal oxides, such as indium tin oxide, indium zinc oxide, aluminum tin oxide, aluminum zinc oxide, indium germanium zinc oxide or other suitable oxides, or stacked layers of at least two of the above.

In the present embodiment, as shown in FIG. 10, the pixel electrode P9 includes a plurality of first branch patterns 651. A slit width between adjacent first branch patterns 651 is ST1. The sub-pixel electrodes P10-1 and P10-2 each includes a plurality of second branch patterns 652. A slit width between adjacent second branch patterns 652 is ST2. It is to be noted that the first branch pattern 651 of the pixel electrode P9 and the second branch pattern 652 of the pixel electrode P10 have different widths. Specifically, the slit width ST between the first branch patterns 651 is smaller than the slit width ST2 between the second branch patterns 652.

As shown in FIG. 10, the pixel electrode P9 is electrically connected to the active device T12. In detail, a contact C13 is disposed between the drain D12 of the active device T12 and the pixel electrode P9. The active device T12 is electrically connected to the main pixel electrode P9 through the contact C13. In addition, the sub-pixel electrodes P10-1 and P10-2 are correspondingly electrically connected to the active device T13. In detail, the drain D13 and a conductive line L13 are connected to each other, and contacts C14 and C15 are respectively disposed between the conductive line L13 and the sub-pixel electrode P10-1 and between the conductive line L13 and the sub-pixel electrode P10-2. The active device T13 is electrically connected to the sub-pixel electrodes P10-1 and P10-2 respectively through the contacts C14 and C15. The pixel electrodes P9 and P10 respectively have voltages $V_{P9}$ and $V_{P10}$.

It is worth mentioning that, in the present embodiment, by dividing a pixel electrode of the pixel structure 613 that corresponds to the blue sub-pixel region into the pixel electrode P9 having a larger area and the sub-pixel electrodes P10-1 and P10-2 having a smaller area, and through the above-mentioned coupled driving design, the blue sub-pixel region is provided with the two different pixel voltages $V_{P9}$ and $V_{P10}$, thereby producing different brightnesses. In this way, the color shift in a side view of pixels at a high gray level is reduced. In addition, the blue sub-pixel region itself is oversaturated. Even if the sub-pixel electrodes P10-1 and P10-2 having the lower voltage $V_{P10}$ are separately formed, the resulting reduction in brightness is little. Moreover, the blue color contributes very little to the brightness. Therefore, the design of the pixel structure 613 has a minor impact on transmittance of the display panel. Based on calculation results, a ratio of an area of the pixel electrode P9 to an area of the pixel electrode P10 (i.e. a sum of areas of the sub-pixel electrodes P10-1 and P10-2) is preferably 4:1. In addition, a voltage ratio $V_{P9}/V_{P10}$ of the pixel electrode P9 to the pixel electrode P10 is preferably 2.85:2.3

In summary, in the pixel structure of the invention, the pixel electrode is divided into two electrodes, and these two pixel electrodes are electrically insulated from each other. The active device is electrically connected to one of the pixel electrodes, and the conductive line is coupled to another pixel electrode to form a coupling capacitance. In this way, the two pixel electrodes in the same pixel structure have different voltages during a driving process, such that the color shift in the side view of the display panel is reduced.

Although the invention has been described with reference to the above embodiments, it will be apparent to persons of ordinary skill in the art that modifications to the described embodiments may be made without departing from the spirit of the invention. Accordingly, the scope of the invention will be defined by the attached claims and not by the above detailed descriptions.

What is claimed is:

1. A pixel structure, the pixel structure corresponding only to a blue sub-pixel region, wherein the pixel structure comprises:
   an active device;
   a first pixel electrode electrically connected to the active device;
   a second pixel electrode electrically insulated from the first pixel electrode, wherein a voltage ratio of the first pixel electrode to the second pixel electrode is 2.85:2.3; and
   a conductive line located below the first pixel electrode and the second pixel electrode, wherein the active device is electrically connected to the first pixel electrode through the conductive line, and the conductive line is coupled to the second pixel electrode to form a coupling capacitance.

2. The pixel structure as claimed in claim 1, wherein a ratio of an area of the first pixel electrode to an area of the second pixel electrode is 4:1.

3. A pixel structure, the pixel structure corresponding only to a blue sub-pixel region, wherein the pixel structure comprises:
   an active device;
   a first pixel electrode electrically connected to the active device;
   a second pixel electrode electrically insulated from the first pixel electrode, wherein the second pixel electrode has a first sub-electrode and a second sub-electrode that are separate from each other, and
   a conductive line located below the first pixel electrode and the second pixel electrode, wherein the active device is electrically connected to the first pixel electrode through the conductive line, and the conductive line is coupled to the first sub-electrode to form a first sub-additional capacitance, and the conductive line is coupled to the second sub-electrode to form a second sub-additional capacitance, wherein a ratio of an area of the first pixel electrode to an area of the first sub-electrode to an area of the second sub-electrode is 3:1:1, and a voltage ratio of the first pixel electrode to the first sub-electrode to the second sub-electrode is 2.85:2.5:2.1.

4. The pixel structure as claimed in claim 3, wherein the first sub-electrode and the second sub-electrode are located on two sides of the first pixel electrode.

5. A pixel structure, the pixel structure corresponding only to a blue sub-pixel region, wherein the pixel structure comprises:
   an active device;
   a first pixel electrode electrically connected to the active device, wherein the first pixel electrode comprises a main pixel electrode and a sub-pixel electrode;
   a second pixel electrode electrically insulated from the first pixel electrode, wherein a ratio of an area of the main pixel electrode to a sum of areas of the sub-pixel electrode and the second pixel electrode is 1:2, and a ratio of the area of the sub-pixel electrode to the area of the second pixel electrode is 4:1, and a voltage ratio of the main pixel electrode to the sub-pixel electrode is 2.85:2.2, and a voltage ratio of the sub-pixel electrode to the second pixel electrode is 2.85:2.3; and
   a conductive line located below the first pixel electrode and the second pixel electrode, wherein the active device is electrically connected to the first pixel electrode through the conductive line, and the conductive line is coupled to the second pixel electrode to form a coupling capacitance.

6. The pixel structure as claimed in claim 3, wherein the conductive line comprises:
   a main portion disposed overlapping the first pixel electrode; and
   a branch portion extending from the main portion, disposed overlapping the second pixel electrode.

7. A pixel array, comprising:
   a plurality of first pixel structures, wherein each of the first pixel structures corresponds to a red sub-pixel region or a green sub-pixel region, and each of the first pixel structure comprises:
   a first active device; and
   a first pixel electrode electrically connected to the first active device; and
   a plurality of second pixel structures, wherein each of the second pixel structures corresponds only to a blue sub-pixel region, and each of the second pixel structures comprises:
   a second active device;
   a second pixel electrode electrically connected to the second active device;
   a third pixel electrode electrically insulated from the second pixel electrode, wherein a voltage ratio of the second pixel electrode to the third pixel electrode is 2.85:2.3; and
   a conductive line located below the second pixel electrode and the third pixel electrode, wherein the second active device is electrically connected to the second pixel electrode through the conductive line, and the conductive line is coupled to the third pixel electrode to form a coupling capacitance.

8. A display panel, comprising:
   a first substrate comprising a pixel array as claimed in claim 7 disposed thereon;
   a second substrate located opposite to the first substrate;
   a color filter layer located on the first substrate or the second substrate; and
   a display medium located between the first substrate and the second substrate.

9. The display panel as claimed in claim 8, wherein:
   the color filter layer comprises a plurality of red filter patterns, a plurality of blue filter patterns, and a plurality of green filter patterns,
   the red filter patterns and the green filter patterns are disposed corresponding to the first pixel structures of the pixel array on the first substrate, and
   the blue filter patterns are disposed corresponding to the second pixel structures of the pixel array on the first substrate.

10. A pixel structure, having red sub-pixel regions, green sub-pixel regions and blue sub-pixel regions, wherein in the pixel structure corresponding only to the blue sub-pixel regions, each of the blue sub-pixel region comprises:
   an active device;
   a first pixel electrode electrically connected to the active device;
   a second pixel electrode electrically insulated from the first pixel electrode, wherein a voltage ratio of the second pixel electrode to the third pixel electrode is 2.85:2.3; and
   a conductive line located below the first pixel electrode and the second pixel electrode, wherein the active device is electrically connected to the first pixel electrode through the conductive line, and the conductive line is coupled to the second pixel electrode to form a coupling capacitance.

\* \* \* \* \*